(12) United States Patent
Wierer, Jr. et al.

(10) Patent No.: US 6,992,334 B1
(45) Date of Patent: *Jan. 31, 2006

(54) MULTI-LAYER HIGHLY REFLECTIVE OHMIC CONTACTS FOR SEMICONDUCTOR DEVICES

(75) Inventors: Jonathan J. Wierer, Jr., San Jose, CA (US); Michael R Krames, Mt View, CA (US); Serge L Rudaz, Sunnyvale, CA (US)

(73) Assignee: Lumileds Lighting U.S., LLC, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/469,652

(22) Filed: Dec. 22, 1999

(51) Int. Cl.
 *H01L 33/00* (2006.01)
(52) U.S. Cl. .......................... 257/98; 257/99; 257/745; 257/766; 257/762
(58) Field of Classification Search ................ 257/77, 257/741, 96, 98, 99, 700, 742–745, 766, 257/762
See application file for complete search history.

(56) References Cited

U.S. PATENT DOCUMENTS

| | | | | |
|---|---|---|---|---|
| 4,355,196 A | | 10/1982 | Chai ........................... 136/259 |
| 5,351,255 A | * | 9/1994 | Schetzina ..................... 327/45 |
| 5,362,977 A | * | 11/1994 | Hunt et al. .................... 257/98 |
| 5,585,648 A | * | 12/1996 | Tischler ........................ 257/77 |
| 5,696,389 A | * | 12/1997 | Ishikawa et al. .............. 257/99 |
| 5,760,423 A | * | 6/1998 | Kamakura et al. ............ 257/99 |
| 5,777,350 A | * | 7/1998 | Nakamura et al. ............ 257/96 |
| 5,789,771 A | * | 8/1998 | Liu et al. ..................... 257/287 |
| 5,917,202 A | * | 6/1999 | Haitz et al. ................... 257/98 |
| 5,932,896 A | * | 8/1999 | Sugiura et al. ............... 257/94 |
| 5,990,500 A | * | 11/1999 | Okazaki ....................... 257/99 |
| 6,057,565 A | * | 5/2000 | Yoshida et al. .............. 257/102 |
| 6,078,064 A | * | 6/2000 | Ming-Jiunn et al. ......... 257/103 |
| 6,169,294 B1 | * | 1/2001 | Biing-Jye et al. ............. 257/79 |
| 6,190,937 B1 | * | 2/2001 | Nakagawa et al. ........... 438/67 |
| 6,194,743 B1 | | 2/2001 | Kondoh et al. |
| 6,486,499 B1 | * | 11/2002 | Krames et al. ............... 257/81 |

FOREIGN PATENT DOCUMENTS

| | | |
|---|---|---|
| DE | 4113 969 A1 | 11/1992 |
| EP | 0 051 172 A1 | 10/1981 |
| EP | B1 005172 | 10/1981 |
| EP | 0 926744 A2 | 6/1999 |
| JP | 60102733 | 6/1985 |
| JP | 6-45651 | 2/1994 |
| JP | 06045651 | 2/1994 |
| JP | 08102550 * | 4/1996 |
| JP | 11-220168 | 8/1999 |
| JP | 11220169 | 8/1999 |
| WO | WO 95/00974 | 1/1995 |

OTHER PUBLICATIONS

Brown et al., "Ohmic contacts to Si-implanted and un-implanted n-type GaN," Mat. Res. Soc. Symp. Proc. vol. 395, 1996 Materials Research Society, pp. 855-860.*

(Continued)

*Primary Examiner*—Jerome Jackson
(74) *Attorney, Agent, or Firm*—Patent Law Group LLP

(57) ABSTRACT

A high performance, highly reflective ohmic contact, in the visible spectrum (400 nm–750 nm), has the following multi-layer metal profile. A uniform and thin ohmic contact material is deposited and optionally alloyed to the semiconductor surface. A thick reflector layer selected from a group that includes Al, Cu, Au, Rh, Pd, Ag and any multi-layer combinations is deposited over the ohmic contact material.

11 Claims, 3 Drawing Sheets

OTHER PUBLICATIONS

InxGa1-xN/AlyN Violet Light Emitting Diodes with Reflective P-Contacts for High Single Sided Light Extraction by P. M. Mensz, P. Kellawon, R. van Roijen, P.Kozodoy, S. Denbaars: Electronics Letters, IEE, Oct. 2, 1997; (vol. 33 No. 24; pp. 2066-2068).

International Search Report for International application No. PCT/US 00/35184 filed Dec. 21, 2000.

Mensz, P. et al., "$In_xGa_{1-x}N/Al_yGa_{1-y}N$ violet light emitting diodes with reflective p-contacts for high single sided light extraction," Electronics Letters, Nov. 20th, 1997, vol. 33, No. 24, pp. 2066-2068.

* cited by examiner

MULTI-LAYER HIGHLY REFLECTIVE OHMIC CONTACTS FOR SEMICONDUCTOR DEVICES

FIELD OF THE INVENTION

This invention relates to electrical contacts on optoelectronic devices such as light-emitting diodes (LEDs).

BACKGROUND

Optoelectronic devices such as light-emitting diodes (LEDs) emit light in response to an excitation signal. A typical LED is a heterostructure that has been deposited on a host substrate via a growth technique such as liquid phase, hydride phase, molecular beam, and metal-organic phase epitaxy. The heterostructure includes n and p-type semiconductor layers that sandwich active light producing layers. Electrical contacts are attached to the n and p-type semiconductor layers. When a forward voltage is applied across the contacts, electrons and holes are injected from the n and p-type semiconductor layers into the active region. Light is produced when the electrons and holes radiatively recombine in the active layer(s).

Wall-plug efficiency is the amount of light power produced compared to the electrical power applied. High wall-plug efficiency can be achieved by maximizing the total efficiency of the device. The total efficiency of the device is a product of the various efficiencies of the device including the injection, internal quantum, and light extraction efficiencies. The first two parameters depend on the material quality of the device (epitaxial growth and electronic band structure) while the light extraction efficiency depends on the geometry and all the light absorption present in the device. The light extraction efficiency is the ratio of the amount of light leaving the LED compared to the amount of light generated inside the LED. One way to increase the light extraction efficiency is to reduce the absorption and redirect light into useful (higher extraction) directions. Therefore, absorbing paths in the device should be avoided and light should be scattered into the proper escape cones of the device. The angle of the escape cones depend on the refraction indices of the light-producing semiconductor and the exiting medium, (e.g. for GaN into air the angle of the escape cone is 25°). The electrical contacts are one example of light absorption in a typical LED. Therefore, it is preferable to reduce the absorption and for some devices also to increase the reflectance in these electrical contacts. This must be done without compromising the contact resistance. Resistance in the electrical contacts leads to wasted energy (electricity) thus lowering the wall-plug efficiency.

Highly reflective ohmic contacts are desirable in LEDs. There are many prior art approaches to creating these types of contacts. The simplest way is to use a thick sheet of the ohmic contact metal. This thick sheet acts as a contact and reflector. A good reflector is one that absorbs less than 25% from an incident hemispherical isotropic light source. Therefore, isotropic light will lose less than 25% of its intensity after reflecting off of this medium (e.g. a maximum reflection of >75%). For the entire visible spectrum (400 nm–750 nm), this leaves two metals that fit the requirement: Al and Ag. Other metals that work in only parts of the visible spectrum are Au, Rh, Cu, and Pd. Although a single thick sheet is preferred, these metals do not always make good ohmic contacts to the selected material system. There are additional reliability issues with the use of Ag because of electromigration, and Cu because it may diffuse into the light-producing active region thereby creating deep levels in some semiconductor materials hindering light output.

One prior art approach, disclosed by Chai, et al. in U.S. Pat. No. 4,355,196, is to pattern the ohmic contact metal, and overlay the ohmic patterned metal with a reflective metal. Although Chai, et al. teaches a reflective contact with a solar cell device, the idea can be extended to all other optoelectronic devices including LEDs. This patterned contact is not advantageous when used on a device with semiconductor layers that do not spread current efficiently laterally (i.e. a low conductivity semiconductor such as p-GaN with a resistivity, $\rho$, greater than 0.5 $\Omega$-cm). The low conductivity semiconductor cannot spread current efficiently from the patterned contact; therefore electrical carriers will not be injected uniformly into the active light-producing region of the device. Non-uniform injection reduces the wall-plug efficiency of the device. Also, patterning of the contacts adds additional complicated processing steps. Any non-uniformity of the pattern will be manifest in non-uniform current injection and light generation. For low conductivity semiconductor devices, the ohmic contact needs to be a uniform sheet. This type of approach is described by Aegenheister, et al. in EP0051172, although not for reasons of uniformly injecting in low conductivity semiconductor devices. It teaches using an Au/Ge (ratio 99:1) ohmic layer that is 200 Å thick. Although this ohmic contact layer is thin for a long wavelength emitting device, this contact is too thick for a device emitting in the visible spectrum (i.e. at 505 nm absorption ~29%). Also, the overlaying reflective metal is Ag. Ag is known to electro-migrate (when used as a p-contact) in devices that operate with high electric fields in humid environment (accelerated) life tests, thus shorting out the device and rendering it useless. Therefore, electro-migrating electrical contacts are not useful in commercial LEDs. A multi-layer highly reflective ohmic contact is also described in P. M. Mensz et. al., Elec. Lett., 33, 2066–2068 (1997) where the contact is Ni/Al or Ni/Ag to p-GaN for a GaN based LED. This approach is also problematic because its operating forward voltage ($V_f$) is 5 V at 20 mA (for a 300 $\mu$m×300 $\mu$m contact area). This voltage is 1.5–2.0 V too high for an GaN LED of that size, indicating that the contact is not ohmic and that specific contact resistance is too high. The additional contact resistance decreases the wall-plug efficiency of the LED device.

SUMMARY OF THE INVENTION

A high performance, highly reflective ohmic contact, in the visible spectrum (400 nm–750 nm) has the following multi-layer metal profile. First, a uniform ohmic contact material is deposited and optionally alloyed to the semiconductor surface. The ohmic contact material is thin (<200 Å) to reduce any absorption associated with it (below 25%), but is thick enough to keep the specific contact resistance below $10^{-2}$ $\Omega$-cm$^2$. A low contact resistance ensures a low forward operating voltage and low resistive electrical losses. The maximum ohmic contact metal thickness will depend greatly on the type of reflector material to achieve a reflectivity of greater than 75%. A reflector layer selected from a group including Al, Cu, Au, Rh, Pd, Ag and any multi-layer combinations is deposited over the ohmic contact material. The appropriate reflector layer yields a combined multi-layer contact reflectivity that has an absorptance, from an incident hemispherically isotropic light source, of <25% (reflectance >75%) at the operating wavelength of the contacted device. Because the reflectivity of a metal increases quickly and asymptotically with thickness the reflector layer should be greater than 500 Å to achieve the maximum reflection. The thick reflector layer is also an excellent way to spread current uniformly across the device especially in low conductivity semiconductors with resistivity, ρ, greater than 0.5 Ω-cm. Although Ag is highly reflective, it electro-migrates in high electric fields and humid environments. Therefore, because of reliability issues, Ag is used only in the low operating electric field embodiments.

In an alternate embodiment, a barrier layer interposes the ohmic and reflector layers to prevent any unwanted device-degrading inter-metallics created by ohmic and reflector layer diffusion. It is desirable to use a thin barrier metal (<100 Å) to keep any absorption associated with it below 25%.

DETAILED DESCRIPTION

Figure 1:
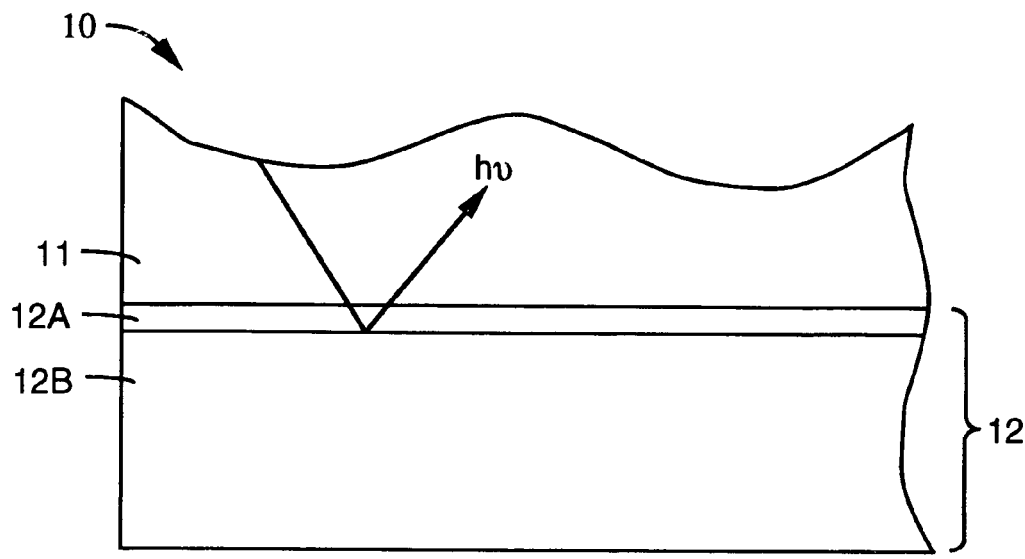
FIG. 1 shows a cross-sectional view of an embodiment of the present invention.

The present invention is a multi-layer contact that consists of multiple material layers providing high reflectivity, low specific contact resistance, and high reliability. FIG. 1 shows a cross-sectional embodiment of a semiconductor device 10 with a multi-layer contact 12. The multi-layer contact 12 includes an ohmic layer 12A and a reflective layer 12B. In combination, the ohmic and reflective layers 12A, 12B form a highly reflective ohmic electrical contact to semiconductor structure 11. Various optoelectronic semiconductor structures 11 can be used with the multi-layer reflective contact layers 12. Symbol hv in FIG. 1 designates the path of a photon reflected by multi-layer contact 12.

Ohmic layer 12A is at least one layer that provides a good ohmic contact to the semiconductor 11. A good ohmic contact has minimal voltage drop (linear I-V, where "I" is current and "V" is voltage) across the semiconductor/metal interface when current flows across it. A figure of merit for contacts is their specific contact resistance. The specific contact resistance varies greatly depending on the semiconductor and contact material, but a good ohmic contact should have a specific contact resistance of less than $10^{-2}$ Ω-cm$^2$. The ohmic layer 12A, which may be optionally alloyed to the semiconductor surface, is thin to minimize the absorption to less than 25% of the light generated in the semiconductor device 10 while being thick enough so that the specific contact resistance is less than $10^{-2}$ Ω-cm$^2$. The composition of the ohmic layer 12A depends on the material system used for the semiconductor structure 11. The thickness of the ohmic layer 12A depends upon on how the specific contact resistance increases as the layers are thinned.

Figure 2:
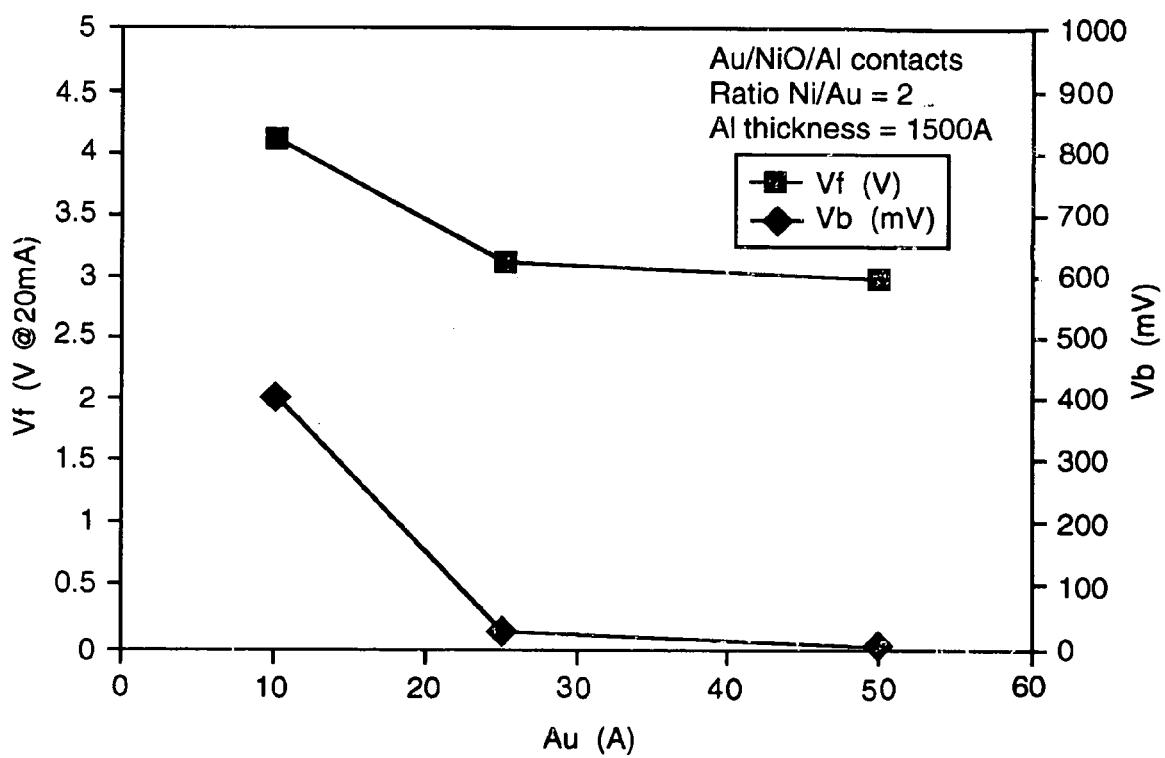
FIG. 2 illustrates how the relationship between contact resistance and forward operating voltage versus the ohmic layer thickness for a p-GaN contact.

For a p-type GaN material system, the composition of the ohmic layer is selected from a group that includes Au, Ni, Pt, Pd, Ti, W, Cr/Au, Ni/Au, Au/NiO, Pt/Au, Pd/Au, Co/Au, Cu/Au, Ni/Pt, Ni/AuZn, Cr/AuZn, Ni/Cr/Au, Ni/Pt/Au, Pt/Ni/Au, Pd/Pt/Au, and TiAlNiAu. FIG. 2 shows an example of how the contact resistance increases as the ohmic layer thickness is thinned for a p-GaN contact. The ohmic layer is Au/NiO and Al is the reflector layer. The Au is intermixed in the NiO layer. Various Au/NiO layer thickness are investigated and the forward operating voltage ($V_f$) at 20 mA (contact area=250 μm×350 μm) and the barrier voltage ($V_b$) across the contact/p-GaN interface versus Au (NiO) thickness are measured. The Au/NiO contact are formed by oxidizing and annealing a bi-layer of Ni/Au (thickness ratio=2/1) in a humid $N_2/O_2$ (80%/20%) atmosphere at elevated temperatures (greater than 575° C.). This oxidation and anneal creates the ohmic layer of NiO intermixed with Au. After oxidation the Al is deposited (~1500 Å) and the contacts are patterned by photolithography and etching. The $V_b$ measurement is performed by applying a voltage between two contacts to the p-GaN, measuring the current flow across the p-GaN and contact interfaces and extrapolating the linear high-current regime to the intercept (zero current). For the given contact area, a specific contact resistance of less than $10^{-2}$ ohm-cm$^2$ has a $V_b$ less than 50 mV. The $V_f$ measurement is performed by attaching one of the voltage probes to the n-GaN layer and the other to the p-GaN contact and applying a voltage across them. For a GaN LED with low specific contact resistance the Vf at 20 mA should be less than 3.5V. Therefore the optimal thickness of Au (Ni) necessary for low specific contact resistance is ~20–35 Å (40–70 Å).

For an n-type GaN system, the composition of the ohmic layer is selected from a group that includes Ti, W, Ti/Al, TiW, W/Al, TiWAl, V, V/Al, and Pd. GaN LEDs with Ti/Al (30 Å/15 KÅ) multi-layer contacts to n-GaN, and p-GaN contacts of Au/NiO/Al have been fabricated yielding a $V_f$=3.0 V at 350 mA with a 1000×1000 μm$^2$ contact area. This Ti/Al contact has a reflectivity of 79%.

For a p-type GaP system, the composition of the ohmic layer may include Au/Be, Au/Zn, Pd/Zn/Pd, Au/Mg, Ni/Au/Be, Ni/Au/Zn, Ni/Au/Mg, and In/Zn. For an n-type GaP system, the composition of the ohmic layer may include Au/Ge, Au/Ni, Au/Si, Au/Sn, Au/Te, In, In/Al, In/Sn, Ni/Si, Si/Pd, Pd/In, Ni/Ge/Au, Ni/Si/Au and Sn. For a p-type GaAs system, the composition of the ohmic layer may be Ti/Au, Ti/Pt/Au, Au/Zn, Au/Be, Au/Mg, Ni/Au, Ni/Au/Mg, Ni/Au/Be, Ti/Au/Be and In/Zn. For an n-type GaAs system, the composition of the ohmic layer may include Ge/Au, Ge/Au/Ni/Au, Au/Sn, Au/Te, In, In/Au, In/Ni, Pd/Ge, Sn/Ni, and Sn/Sb. For an n-type SiC, the composition of the ohmic layer may include Pd, Pt, Ai/Si, Ti, Au, Ni, Cr, Ti/Si, TaSi, and Si/Ni.

Reflective layer 12B is selected from a group that includes Al, Cu, Rh, Au, Pd, and Ag, alone and any combination. Ag is used in special cases because of electro-migration issues. Al does not electro-migrate as severely as Ag and therefore can be used more reliably in reflective multi-layer contacts. Using Al as the reflector, the maximum ohmic layer thickness in the visible region is 150 Å for Rh, 200 Å for Cu, and 100 Å for Au in order to achieve a reflectivity of greater than 75%. Ohmic contact metals that are more absorbing need to be less than 100 Å in the visible spectrum. The reflector layer is greater than 500 Å thick so that no light will pass through; thus maximum reflectivity is achieved. This layer not only acts as the light reflector but it also will do most of the lateral current spreading, because of the thickness. This is beneficial because the ohmic layer 12A is typically too thin to spread current effectively on its own. Current spreading by a thick reflector layer (>500 Å) in optoelectronic devices, has many benefits including low $V_f$ (lower spreading resistance). Also, the reflector layer connects any discontinuity in the multi-layer contact created by the surface roughness of the semiconductor structure surface.

Figure 3:
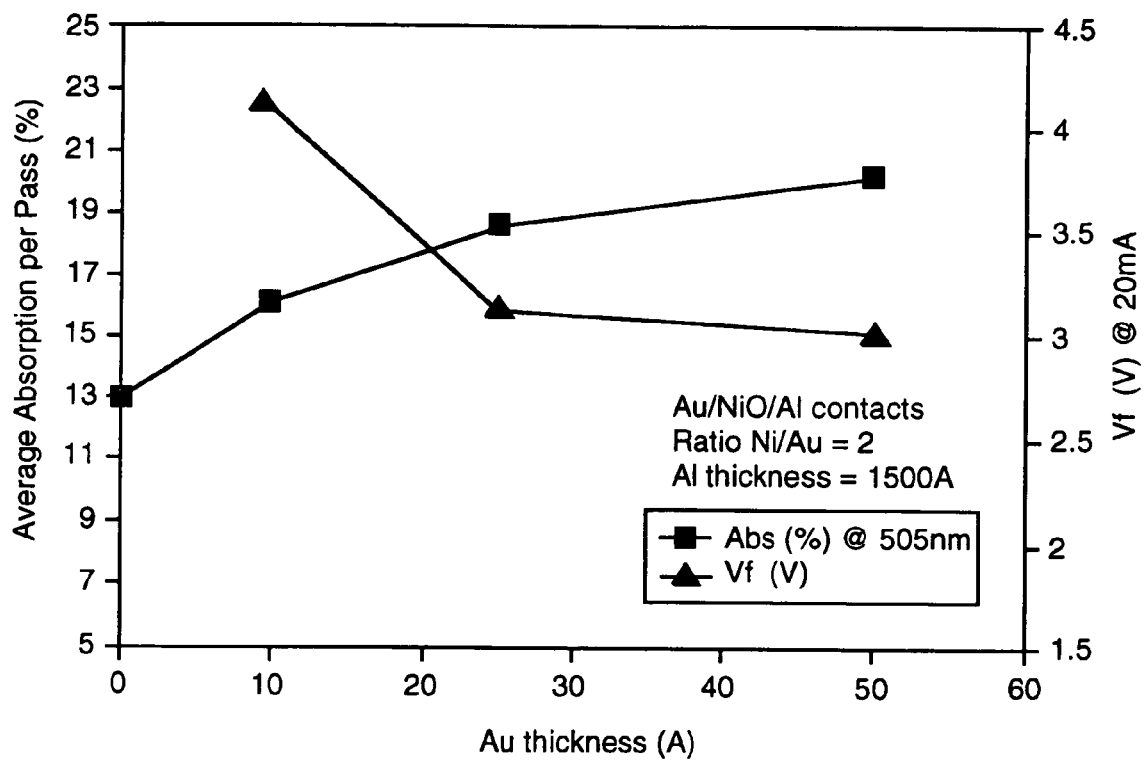
FIG. 3 shows the theoretical absorption per pass and forward operating voltage versus Au thickness for a p-GaN Au/NiO/Al contact.

The Au/NiO/Al contact is a multi-layer contact with high reflectivity. FIG. 3 shows the theoretical average absorption per pass (at 505 nm), and $V_f$ (at 20 mA) for the p-GaN Au/NiO/Al contact. The Al thickness is kept constant at ~1500 Å, and the deposited Ni/Au thickness is varied keeping a thickness ratio of 2/1 (before the oxidation and anneal). As the Au/NiO contact layer is thinned, the contact approaches the minimum one pass isotropic absorption (maximum reflection) of ~13%. Also as shown above, the $V_f$ increases as the Ni/Au thickness is decreased because of the increase in specific contact resistance. This illustrates the trade-off between specific contact resistance and reflectivity. This optimization technique can be applied to determine the thinnest ohmic layer to maximize reflection while preserving low specific contact resistance in multi-layer contacts. Also, this optimization of the contact insures devices with high wall-plug efficiencies.

Figure 4:
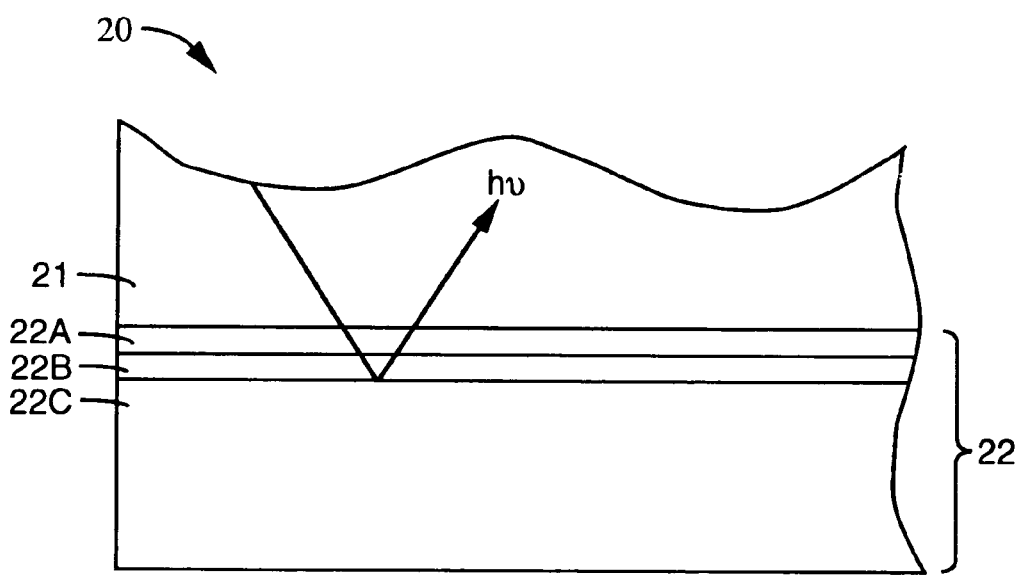
FIG. 4 shows an alternate embodiment of the present invention.

FIG. 4 illustrates an alternate embodiment of the multi-layer contact 22 to a semiconductor device 20 with multiple contact layers 22A, 22B, and 22C. Ohmic layer 22A provides ohmic contact to semiconductor 21. A barrier metal layer 22B interposes the ohmic layer 22A and the reflector layer 22C. The barrier layer 22B is used to prevent diffusion of the ohmic layer 22A into the reflector layer 22C, thus preventing the creation of any inter-metallics. These inter-metallics could degrade the specific contact resistance and reflectivity of the contact and thus the efficiency of the device. This is a reliability issue that should be avoided for long lasting devices. The barrier metal layer should be kept thin, e.g. <100 Å, to minimize light absorption and should be as reflective as possible to contribute to the reflectivity of the contact. Exact metals will vary depending on the ohmic layer 22A and reflector layer 22C but some candidates include Ni, Co, NiO, Rh, Cr, Pt, Mo, Ti, TiW, WSi, WSi:N, TaSi, TaSi:N, InSnO, or TiW:N. The ohmic layer 22A and reflector layer 22C provide the same function as described in the first embodiment.

An example of a multi-layer contact as described in the alternative embodiment suitable for a p-GaN material system has Ni/Au as the ohmic layer 22A, Rh as a barrier metal layer 22B, and Al as the reflector layer 22C. Just as in the Au/NiO/Al contact, the Au is preferably ~20–35 Å thick to make a good ohmic contact. The Rh is preferably ~25–50 Å thick to separate the Au from the Al. A GaN LED with a Ni/Au/Rh/Al (10 Å/30 Å/50 Å/2200 Å) p-GaN contact and a Ti/Al n-GaN contact has a $V_f$=3.2 V at 20 mA for a 350×250 $\mu m^2$ die. The reflectivity of this contact is 75%.

Figure 5:
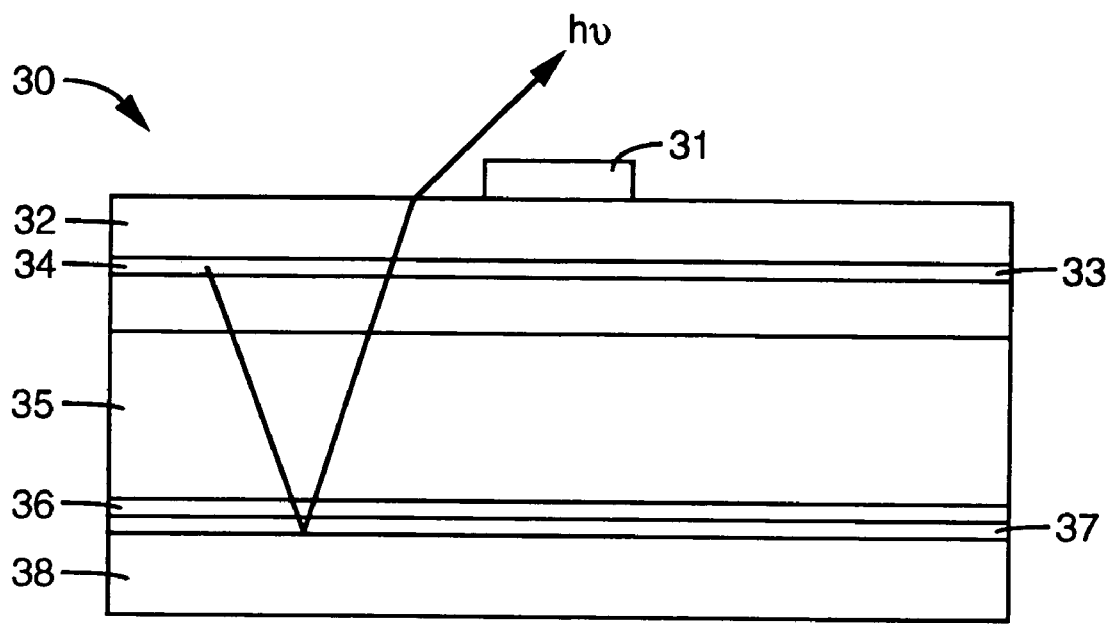
FIG. 5 shows a vertical current LED structure.

FIG. 5 shows a vertical current LED structure. The multi-layer contact is located on the bottom-side of a LED device 30 that has a conductive substrate 35 so that contacts can be placed on opposing sides of the device creating vertical current (perpendicular to the contacts) paths. A top contact 31 is either a small area contact or a thin full sheet (not shown) to minimize absorption. The top contact 31 is the electrical contact layer to the n or p-type semiconductor layer(s) 32 of the LED. An active light producing region 33 interposes the top and bottom n or p-type semiconductor layer(s) 32, 34. Either of the multi-layer contacts shown in FIG. 1 or 4 may be used with an ohmic contact layer 36, a reflector layer 38, and a barrier layer (for the alternative embodiment) 37.

In another configuration, the top contact 31, shown in FIG. 5, is also a multi-layer contact as shown in either FIGS. 1 and 4.

The material with the greatest reflectivity in the visible region is Ag. Ag is known to electro-migrate (when used as a p-type contact) in devices that operate in humid environment (accelerated) life tests, thus shorting out the device and rendering it useless. For commercial LEDs, it is desirable to have devices that last for greater than 10,000 hours. LEDs such as the vertical conducting structure (FIG. 5) may operate at sufficiently low enough electric fields, therefore shorting due to Ag migration will not occur within this time frame. For example, AlInGaP based vertical current LEDs operating at low electric fields (E≦500 V/cm) and with contacts containing Ag are not known to exhibit any Ag electro-migration effects. Under these low field conditions, Ag can be used in the reflector 38 and ohmic contact layer 36.

Figure 6:
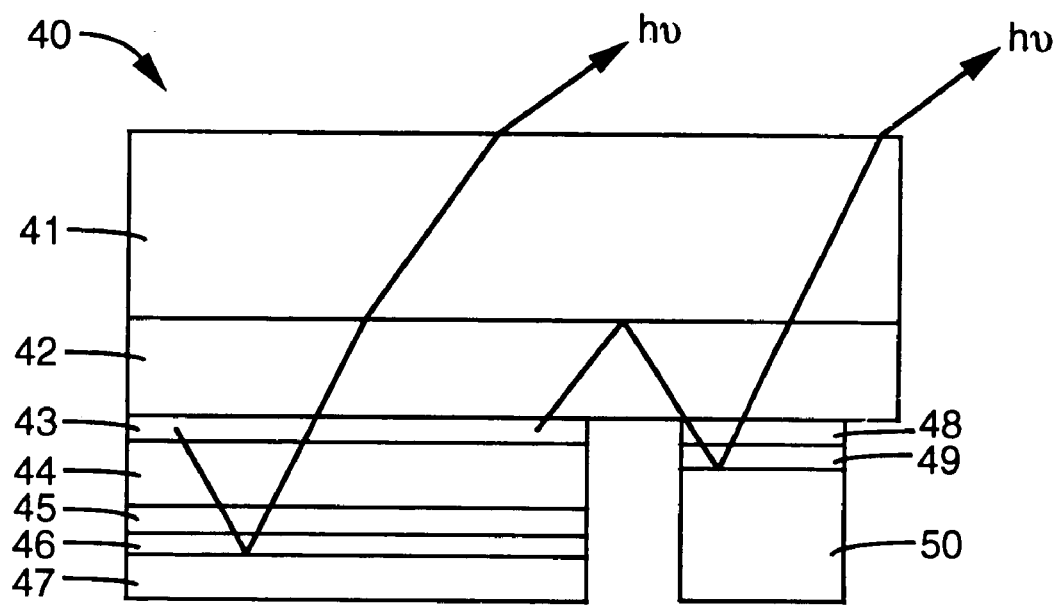
FIG. 6 shows a lateral current LED structure.

An alternate configuration for an LED device 40 with multi-layer contacts is shown in FIG. 6. The contacts are attached on the same side of the device because substrate 41 is non-conductive to create a device that relies on lateral current (parallel to the contacts) to operate. This is made possible by exposing the lower conducting n or p-type layer 42 by etching. The active light-producing region 43 interposes the top and bottom n or p-type layer(s) 42, 44. Either of the multi-layer contact shown in FIGS. 1 and 4 may be used with an ohmic contact layer 45,48, a reflector layer 47,50, and a barrier layer (for the alternative embodiment) 46, 49.

In FIG. 6, the LED device 40 could consist of layers 42,43, and 44 that are materials such as GaN, InN, AlN, InGaN, AlGaN, AlInN, or InAlGaN that are grown on a sapphire substrate 41. The semiconductor layers are contacted by either of the multi-layer contacts shown in FIGS. 1 and 4. For a GaN device, it is preferable to use Au/NiO/Al or Ni/Au/Rh/Al p-contacts and the Ti/Al n-contact.

We claim:

1. A light-emitting semiconductor device comprising:
   a semiconductor structure having at least one p-type and one n-type layer; and
   a p contact and an n contact, the p contact electrically connected to the p-type layer, the n contact electrically connected to the n-type layer, wherein at least one of the p and n contacts is a multi-layer contact external to the semiconductor structure, the multi-layer contact comprising:
   a metallic reflector layer comprising Ag; and
   a continuous uniform conducting sheet adjacent to the semiconductor structure, wherein the continuous uniform conducting sheet comprises Ni and makes ohmic contact to the structure;
   wherein the multi-layer contact has a reflectivity greater than 75% for light at an operating wavelength of the light-emitting device and a specific contact resistance less than $10^{-2}$ Ω-$cm^2$.

2. A device, as defined in claim 1, the multi-layer contact further comprising a barrier layer interposing the reflector layer and the continuous uniform conducting sheet.

3. A device, as defined in claim 1, the reflector layer having a thickness greater than 500 Å.

4. A device, as defined in claim 1, wherein the continuous uniform conducting sheet has a thickness less than 200 Å.

5. A device, as defined in claim 1, wherein the continuous uniform conducting sheet is selected from the group that consists of Au/NiO and Ni/Au.

6. A device, as defined in claim 1, wherein the semiconductor structure includes at least one III-nitride layer.

7. A device, as defined in claim 1, wherein the continuous uniform conducting sheet absorbs less than 25% of light generated in the semiconductor structure and incident on the continuous uniform conducting sheet.

8. A device, as defined in claim 6, wherein a voltage required to forward bias the device is less than 3.5 V.

9. A device, as defined in claim 1, wherein the continuous uniform conducting sheet has thickness less than 100 Å.

10. A light-emitting semiconductor device comprising:
a semiconductor structure having at least one p-type and one n-type layer; and
a p contact and an n contact, the p contact electrically connected to the p-type layer, the n contact electrically connected to the n-type layer, wherein at least one of the p and n contacts is a multi-layer contact external to the semiconductor structure, the multi-layer contact comprising:
a metallic reflector comprising Al; and
a continuous uniform conducting sheet adjacent to the semiconductor structure, wherein the continuous uniform conducting sheet comprises Ni and makes ohmic contact to the structure;
wherein the multi-layer contact has a reflectivity greater than 75% for light at an operating wavelength of the light-emitting device and a specific contact resistance less than $10^{-2}$ Ω-cm$^2$.

11. A device, as defined in claim 10, wherein:
the continuous uniform conducting sheet comprises Au.

* * * * *